(12) United States Patent
Stacey

(10) Patent No.: US 7,286,588 B2
(45) Date of Patent: Oct. 23, 2007

(54) SEMICONDUCTOR LASER WITH GRATING STRUCTURE FOR STABILIZING THE WAVELENGTH OF OPTICAL RADIATION

(75) Inventor: Simon Jonathan Stacey, Ipswich (GB)

(73) Assignee: Avago Technologies Fiber IP (Singapore) Pte Ltd, Singapore (SG)

( * ) Notice: Subject to any disclaimer, the term of this patent is extended or adjusted under 35 U.S.C. 154(b) by 247 days.

(21) Appl. No.: 11/017,142

(22) Filed: Dec. 20, 2004

(65) Prior Publication Data
US 2005/0152422 A1    Jul. 14, 2005

(30) Foreign Application Priority Data
Jan. 14, 2004    (GB)    .................................. 0400746.4

(51) Int. Cl.
*H01S 3/08*    (2006.01)
*H01S 3/13*    (2006.01)
*H01S 5/00*    (2006.01)

(52) U.S. Cl. .................. 372/102; 372/92; 372/96; 372/29.02; 372/43.01

(58) Field of Classification Search ............. 372/29.02, 372/32, 46.01, 96, 102, 49.01, 50.11, 92, 372/43.01
See application file for complete search history.

(56) References Cited

U.S. PATENT DOCUMENTS

| 4,399,542 | A  | * | 8/1983  | Kawanishi ............. 372/46.011 |
| 4,856,017 | A  |   | 8/1989  | Ungar ......................... 372/96 |
| 5,206,877 | A  | * | 4/1993  | Kahen .......................... 372/96 |
| 5,224,113 | A  |   | 6/1993  | Tsang ...................... 372/45.01 |
| 5,926,493 | A  | * | 7/1999  | O'Brien et al. .......... 372/50.11 |
| 6,501,776 | B1 | * | 12/2002 | Numai ..................... 372/45.01 |
| 6,807,215 | B2 | * | 10/2004 | Lam et al. ............... 372/50.11 |
| 6,822,982 | B2 | * | 11/2004 | Yoshida et al. ............... 372/20 |
| 2003/0039285 | A1 | * | 2/2003 | Yatsu et al. .................... 372/45 |
| 2003/0047738 | A1 | * | 3/2003 | Funabashi et al. ............ 257/79 |
| 2003/0063647 | A1 | * | 4/2003 | Yoshida et al. ................ 372/50 |
| 2003/0072344 | A1 | * | 4/2003 | Lam et al. ..................... 372/50 |
| 2003/0108081 | A1 | * | 6/2003 | Ryu et al. ..................... 372/102 |
| 2005/0018741 | A1 | * | 1/2005 | Nomaguchi .................. 372/96 |

FOREIGN PATENT DOCUMENTS

WO    WO 03/007443    1/2003

* cited by examiner

*Primary Examiner*—Minsun Oh Harvey
*Assistant Examiner*—Phillip Nguyen

(57) ABSTRACT

An optoelectronic device having a semiconductor laser diode and a grating structure for stabilizing the optical wavelength of optical radiation generated by the laser diode.

9 Claims, 4 Drawing Sheets

SEMICONDUCTOR LASER WITH GRATING STRUCTURE FOR STABILIZING THE WAVELENGTH OF OPTICAL RADIATION

FIELD OF THE INVENTION

The present invention relates to an optoelectronic device having a semiconductor laser diode and a grating structure for stabilizing the optical wavelength of optical radiation generated by the laser diode.

DISCUSSION OF THE BACKGROUND ART

Many optoelectronic systems require a single-mode source of optical radiation. For example, optical communications systems typically require a source of optical radiation at wavelengths around 850 nm, 1310 nm or 1550 nm.

A laser diode used in a transmitter unit as part of a wavelength division multiplexing (WDM) fibre optic communications system may need to have a wavelength stability of within ±2 nm or better, depending on the number and spacing of different optical wavelengths to be carried by the fibre optic system. If wavelengths drift outside the specified ranges, then there will be cross-talk between adjacent channels in the WDM system.

However, the gain peak of a semiconductor laser may not coincide with a single optical mode and will, in general, change with both carrier density and temperature of the active semiconductor medium. For example, the Fabry-Perot (FP) gain profile of a typical III-V material semiconductor laser diode will have a maximum at a particular wavelength $\lambda_0^{FP}$, and the value of $\lambda_0^{FP}$ will normally vary by an amount $\Delta\lambda^{FP}=0.5$ nm/° C.

It is therefore often necessary to stabilize the operation of a semiconductor laser to suppress FP side modes, and to stabilize the wavelength of the optical radiation generated by the laser diode on a single generated mode.

One way of stabilizing the wavelength is to incorporate a grating structure with the laser diode. One example of a grating structure is a Distributed Feedback (DFB) grating. A DFB grating normally extends the length of a laser diode cavity, being integrated in an epitaxially grown cap layer above a waveguide layer and extending longitudinally between end facets that define the laser cavity. A DFB grating is normally a passive non-tuneable structure that stabilizes to some degree the laser wavelength, but without affording the ability to tune the laser wavelength Another type of grating which can be used to tune the laser wavelength is a Distributed Bragg Reflector (DBR) structure. A DBR structure is usually incorporated in a waveguide that is separate from the waveguide containing the semiconductor lasing medium. A DBR structure may also be monolithically integrated with a laser diode structure on a common semiconductor substrate, or may be a discrete device that is integrated with a discrete laser device, for example being bonded to a common substrate.

In some applications, the temperature of the laser diode may also need to be stabilized, for example with an electrical heater if the laser diode is to be used at low operating temperatures (for example between 0° C. and −40° C.), or with a thermoelectric cooler if the laser diode is to be used at high operating temperatures (for example between 30° C. and 60° C.). This, however, adds complexity and cost to an optoelectronic component that includes such a temperature stabilized device. For these reasons it is desirable in low cost applications not to have temperature stabilization of the laser diode. The invention is particularly concerned with such low cost devices, but is also applicable to devices having temperature stabilization where such stabilization is not fully effective in all operating conditions to control the operating temperature of the laser diode, particularly at low temperatures of operation.

An advantage of incorporating a grating structure in an optoelectronic component having a laser diode is that the wavelength selected by the grating is more stable to temperature variations than the Fabry-Perot (FP) gain profile of the laser cavity itself. For example, in a device in which the FP profile may have a central peak $\lambda_0^{FP}$ which varies by an amount $\Delta\lambda^{FP}=0.5$ nm/° C., the grating wavelength $\lambda_0^{G}$ may vary by only $\Delta\lambda^{G}=0.08$ nm/° C.

As is well-known, laser diode devices become more efficient at lower operating temperatures, which is to say that the threshold current for laser operation is reduced at lower operating temperatures. In a grating-stabilized laser diode, one facet of the laser cavity is made highly reflective and the other facet is made anti-reflective and functions as an output facet for the generated optical radiation. As compared with a cavity in which both facets have moderate or high reflectivity, this has the effect of raising the threshold current for the FP modes of operation. Compared with the FP modes of operation, the threshold of the single grating mode is substantially independent of the reduced facet reflectivity, since the grating stabilization is dependent on the interaction of the optical radiation on the multiple regularly spaced elements that form the grating. The threshold current of the single grating mode is therefore lower than any of the FP modes of operation. The result is that the anti-reflection coating has the effect of suppressing FP modes of operation relative to the single grating mode. The output optical radiation is then stabilized by the grating mode.

As the operating temperature of the laser diode and grating structure is changed, the grating wavelength $\Delta\lambda^{G}$ shifts at $\Delta\lambda^{G}=0.08$ nm/° C. owing to a change in the refractive index of the lasing medium. Therefore, the grating wavelength $\Delta\lambda^{G}$ drops as the temperature drops. The threshold current of the single grating mode therefore also drops, but not as quickly as the threshold current of the suppressed FP modes of operation, because these have a higher wavelength/temperature coefficient $\Delta\lambda^{FP}=0.5$ nm/° C. Therefore, at a sufficiently low temperature the threshold current of the suppressed FP modes will have dropped to the level of the grating threshold, and at this point the output of the laser diode will switch to operation at the shorter FP modes. This instability limits the low temperature operation of the laser diode.

Apart from temperature stabilization, a number of prior art approaches have been suggested to dealing with this problem. One is to decrease the output facet reflectivity and/or to extend the anti-reflection bandwidth to shorter wavelengths in order to further suppress the gain of the FP modes of operation at shorter wavelengths and hence lower operating temperatures. This approach suffers from the disadvantage that such higher performance anti-reflection coatings are more expensive to produce.

Another approach is described in U.S. Pat. No. 6,501,776 B1, in which the growth structure and hence band gaps of the semiconductor materials in the laser active medium and the grating structure are modified to change the values of $\Delta\lambda^{FP}$ and $\Delta\lambda^{G}$ so that the FP and grating gains do not converge at low temperatures. This, however, requires precise control of the growth of the semiconductor layers forming the active medium and grating structure, which adds to manufacturing cost, and also compromises the general device performance by reducing the overall efficiency of the device.

It is an object of the present invention to provide a more convenient optoelectronic device having a semiconductor laser and a grating structure for stabilizing the optical wavelength of optical radiation generated by the laser.

SUMMARY OF THE INVENTION

According to the invention, there is provided an optoelectronic device, comprising a semiconductor laser for generating optical radiation, and a grating structure for stabilizing the optical wavelength of said optical radiation against temperature induced changes, wherein:

the laser includes a laser cavity defined by a first end facet and a second end facet, the first end facet having a low reflectivity for substantially transmitting said generated optical radiation from said cavity and for suppressing Fabry-Perot modes of the laser cavity relative to at least one grating mode, and the second end facet being a high reflectivity facet for substantially reflecting said generated optical radiation within said cavity;

the laser and grating structure are arranged so that the grating structure stabilizes the optical wavelength of said generated optical radiation between a longer wavelength operating limit $\lambda_L$ and a shorter wavelength operating limit $\lambda_S$ when the temperature of the laser varies between, respectively, an upper temperature limit and a lower temperature limit;

the low reflectivity of the first end facet extends beyond both $\lambda_L$ and $\lambda_S$ to, respectively, a maximum wavelength $\lambda_{MAX}$ and a minimum wavelength $\lambda_{MIN}$ beyond which the reflectivity of the first end facet rises and no longer suppresses Fabry-Perot modes of the laser cavity; and characterized in that the high reflectivity of the second end facet does not extend fully between $\lambda_S$ and $\lambda_{MIN}$ so that Fabry-Perot modes having a wavelength between $\lambda_S$ and $\lambda_{MIN}$ are additionally suppressed relative said at least one grating mode.

Because the Fabry-Perot (FP) modes will shift to longer wavelengths at a higher rate than the grating mode(s) for a given temperature change, the reflectivity properties of the first and second end facets therefore provide suppression of the FP modes of operation between the wavelengths $\lambda_L$ and $\lambda_S$. At grating mode wavelengths, the grating will then experience a higher effective reflectivity within the cavity than the FP modes with the result that the grating modes will have a lower current threshold for operation than the FP modes of operation. A central grating mode will normally be chosen to coincide with a peak in the gain of the semiconductor lasing medium, and because the grating modes are relatively widely spaced in wavelength, it will normally be the case that just one grating mode is excited, so that the laser operates in just a single mode.

Because the wavelength of the grating modes are shifted less in wavelength by temperature variations than the FP modes of operation, the wavelength of optical radiation generated by the optoelectronic device is then relatively insensitive to changes in the temperature of the device.

Then, as the temperature of the device drops, the wavelength of the FP modes shifts to wavelengths shorter than $\lambda_S$. A point would then be reached when the FP wavelength reaches the lower limit of the anti-reflection facet at $\lambda_{MIN}$, after which the reflectivity of the first facet will begin to rise, thereby decreasing the threshold current for FP modes of operation. The invention counters for this effect by providing a compensating decrease in reflectivity for the second facet, which has the effect of reducing the gain of the FP modes of operation at wavelengths shorter than $\lambda_S$. The overall effect is to extend the operation of the grating modes to shorter wavelengths, and hence lower operating temperatures without the difficulty and expense of having to extend the bandwidth of the low reflectivity first facet to shorter wavelengths.

Preferably, the laser has a lasing medium with a laser gain profile having a peak at a wavelength, which lies between $\lambda_L$ and $\lambda_S$.

In order to provide good suppression of FP modes, the first end facet should have a reflectivity of no more than 0.5%, and most preferably of no more than 0.1%, to optical radiation within the laser cavity over substantially most of the wavelength range between $\lambda_L$ and $\lambda_S$.

In order to provide good operating efficiency, the second end facet should have a reflectivity of at least 80%, and most preferably at least 90%, over substantially most of the wavelength range between $\lambda_S$ and $\lambda_{MAX}$.

Preferably, the second end facet has a reflectivity that drops towards shorter wavelengths over substantially most of the wavelength range between $\lambda_S$ and $\lambda_{MIN}$. In a preferred embodiment of the invention, the reflectivity of the second end facet drops to or below 25% between $\lambda_S$ and $\lambda_{MIN}$.

Also according to the invention, there is provided a method of fabricating an optoelectronic device, comprising the steps of:

forming a semiconductor laser for generating optical radiation;

forming a grating structure for stabilizing the optical wavelength of said optical radiation against temperature induced changes;

providing the laser with a laser cavity defined by a first end facet and a second end facet, the first end facet having a low reflectivity for substantially transmitting said generated optical radiation from said cavity and for suppressing Fabry-Perot modes of the laser cavity relative to at least one grating mode, and the second end facet being a high reflectivity facet for substantially reflecting said generated optical radiation within said cavity;

arranging the laser and grating structure so that the grating structure stabilizes the optical wavelength of said generated optical radiation between a longer wavelength operating limit $\lambda_L$ and a shorter wavelength operating limit $\lambda_S$ when the temperature of the laser varies between, respectively, an upper temperature limit and a lower temperature limit;

selecting the low reflectivity of the first end facet so that this extends beyond both $\lambda_L$ and $\lambda_S$ to, respectively, a maximum wavelength $\lambda_{MAX}$ and a minimum wavelength $\lambda_{MIN}$ beyond which the reflectivity of the first end facet rises and no longer suppresses Fabry-Perot modes of the laser cavity; and characterized in that the method comprises the step of selecting the high reflectivity of the second end facet so that this does not extend fully between $\lambda_S$ and $\lambda_{MIN}$ so that Fabry-Perot modes having a wavelength between $\lambda_S$ and $\lambda_{MIN}$ are additionally suppressed relative said at least one grating mode.

BRIEF DESCRIPTION OF THE DRAWINGS

The invention will now be further described by way of example, with reference to the accompanying drawings, in which.

DETAILED DESCRIPTION OF THE PREFERRED EMBODIMENT

Figure 1:
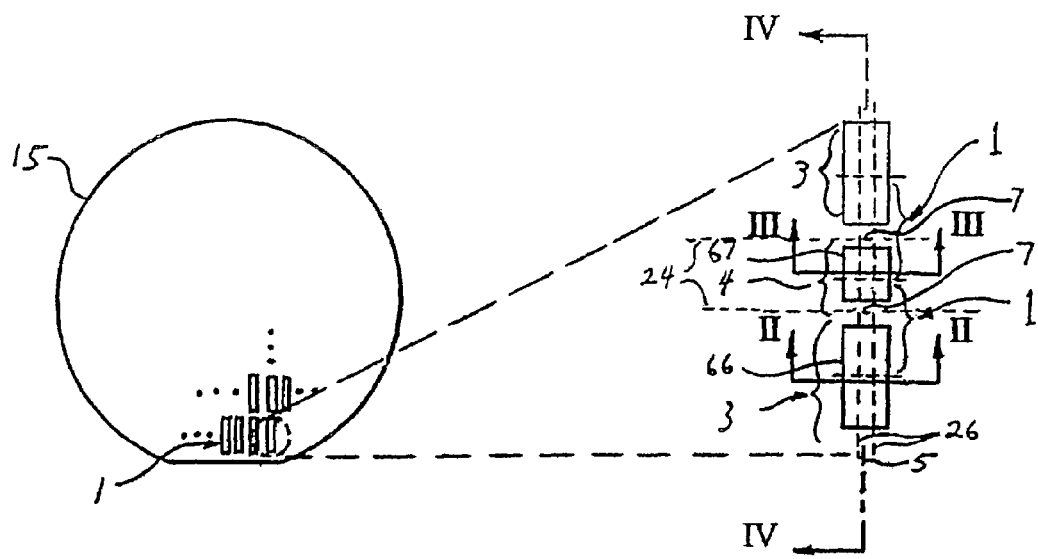
FIG. 1 is a schematic plan view of a semiconductor wafer on which has been grown on a common substrate a number of semiconductor layers from which an optoelectronic device according to a preferred embodiment of the invention may be formed, the optoelectronic device here being a Distributed Bragg Reflector (DBR) structure having a laser section that is butt coupled with a DBR section.

FIG. 1 shows a schematic plan view of a finished III-V semiconductor material wafer 15 on which have been deposited a number of semiconductor layers for forming a plurality of monolithically integrated III-V optoelectronic devices 1 according to the invention. Each device 1 is a Distributed Bragg Reflector (DBR) device formed from a laser section 3 and a DBR section 4. These sections 3, 4 are elongate and extend along an optical axis 5, which extends in one direction towards a similar device 1. Each DBR section 4 is butt-coupled with the longitudinally adjacent laser sections 3 at a junction 7.

Figure 4:
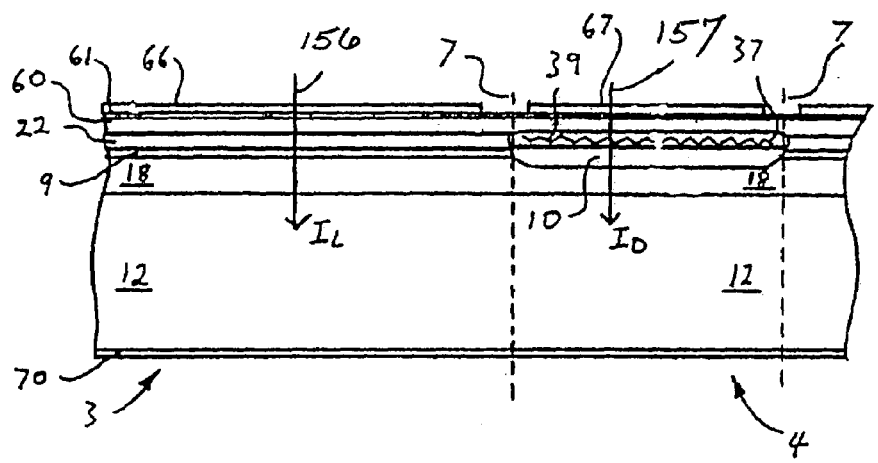
FIG. 4 is a schematic longitudinal cross-section of the DBR structure of FIG. 1 taken along the line IV-IV of FIG. 1.
Figure 5:
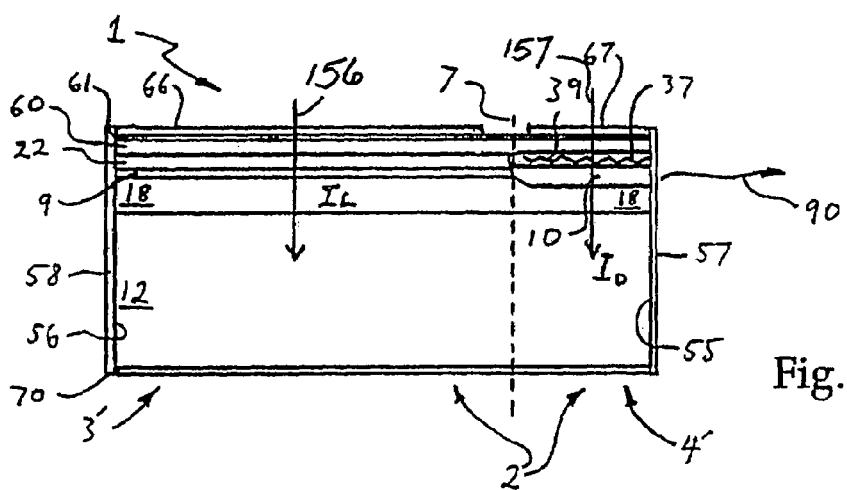
FIG. 5 is a schematic longitudinal cross-section of the DBR structure of FIG. 1, after this has been cleaved into individual DBR devices and provided with an anti-reflection coating on one facet and a high reflection coating on the other facet.
Figure 6:
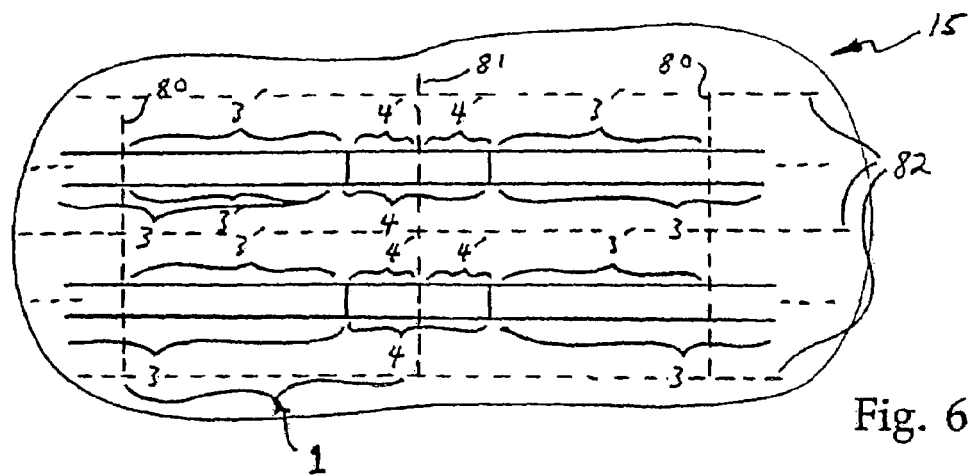
FIG. 6 is a schematic enlarged plan view of a portion of the wafer of FIG. 1, showing how the DBR structure is cleaved into individual DBR devices.

Reference is now made also to FIGS. 2 to 5, which show respectively the structures of the laser and DBR sections 3, 4 of the DBR device 1, and also to FIG. 6 which illustrates how each device 1 is monolithically integrated on a common InP substrate 12 and then cleaved from adjacent devices. For the purposes of clarity, these Figures are schematic only, and do not show dimensions to scale.

Figure 2:
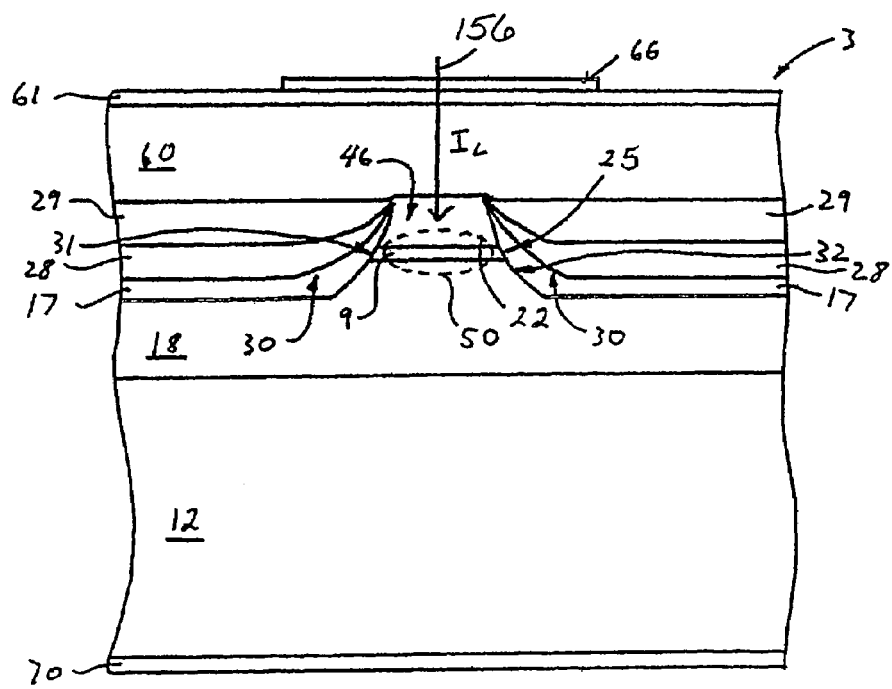
FIG. 2 is a schematic transverse cross-section of the laser section of the DBR structure of FIG. 1, taken along the line II-II, showing a buried heterostructure semiconductor laser junction comprising an active layer within a buried mesa stripe, a current conduction region for channelling current to the active layer, and a pair of current confinement regions either side of the buried mesa stripe.

FIG. 2 shows a transverse cross section through the laser diode section 3 of the DBR device. The laser diode section 3 has a buried heterostructure laser diode waveguide layer 9 suitable for use as a transmitter in a fibre-optic link operating between 1270 nm and 1600 nm. In this example, the nominal wavelength of the device at 25° C. is 1550 nm. The invention is, however, not limited to this wavelength, and may employ any suitable wavelength that may be generated from a semiconductor laser.

Figure 3:
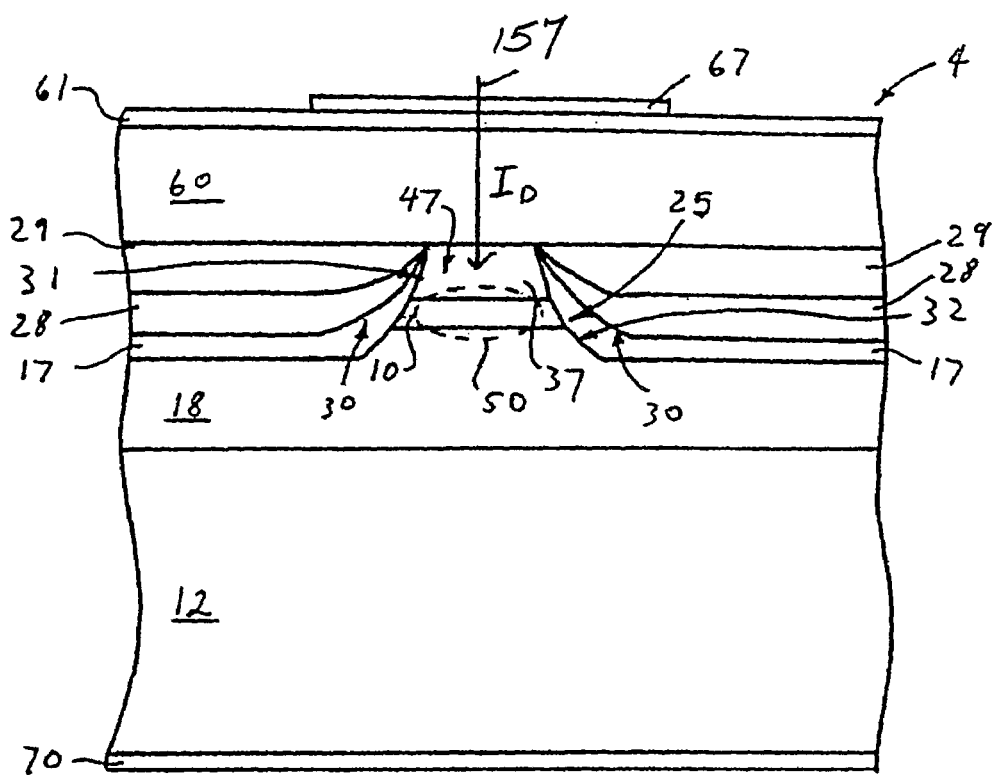
FIG. 3 is a schematic transverse cross-section of the DBR section of the DBR structure of FIG. 1, taken along the line III-III, showing a DBR waveguide in the buried mesa stripe, a current conduction region for channelling current to the DBR waveguide, and a pair of current confinement regions either side of the DBR waveguide.

FIG. 3 shows a transverse cross-section through the DBR section 4 of the DBR device 1. The DBR section 4 has a buried grating waveguide 10 suitable for stabilising the wavelength of the laser output from the laser diode section 3.

Referring now also to FIG. 5, the devices 1 are formed starting from an initial wafer 15 that is around 50 mm in diameter, and that has an n-InP substrate 12 doped to around $10^{19}$ cc$^{-1}$, on which is grown a number of n-type and p-type III-V semiconductor layers. These layers are deposited using well-known MOCVD techniques. The p-type dopant is zinc, and the n-type dopant is sulphur.

The first grown layer is a 2 μm thick n$^-$-InP buffer layer 18 doped to around $10^{18}$ cc$^{-1}$.

An active waveguide layer 9 is then grown on the buffer layer 18 according to known techniques for fabricating planar active layers for a laser diode. The active layer could be a bulk region or a strained multiple quantum well (SMQW) structure. An example of an SMQW device is discussed in W. S. Ring et al, Optical Fibre Conference, Vol. 2, 1996 Technical Digest Series, Optical Society of America. The type of active layer employed is not critical to the invention.

In the present example, the laser diode section 3 has a quaternary multiple quantum well (MQW) $In_xGa_{1-x}As_{1-y}P_y$ active layer 9 that may be between about 100 nm to 300 nm thick.

The active waveguide layer 9 is then topped by a cladding layer 22, formed from p$^+$-InP material, grown to be between about 100 nm to 1 μm thick.

The oxide layer is photolithographically patterned with a photoresist to leave a patterned mask on the exposed cladding layer 22 consisting of pairs of elongate parallel masked areas. The mask may be $SiO_2$ deposited by a plasma enhanced chemical vapour deposition (PECVD) process. It should, however, be noted that silicon nitride would be a suitable alternative choice to $SiO_2$. Each masked area defines an exposed rectangular stripe area, shown schematically by dashed parallel lines 24 in FIG. 1 that extend transverse to the longitudinal axis 5 of each device 1.

The exposed active and cladding layers 9, 11, 22 inside the unmasked area 24 are then removed in a wet-etch process which cuts down into the buffer layer 18. It would, however, be possible to use a reactive ion dry etching process. The DFB section 4 may then be formed from material deposited between the paired dashed lines 24.

The active waveguide layer 10 for the DBR section is then grown on the buffer layer 18 of the non-masked portions of the processed wafer 15 according to known butt-coupling techniques for fabricating planar active layers for a DBR device. As shown in FIG. 3, this active waveguide layer 10 is thicker than the adjacent active waveguide layer 9 for the laser section 3.

A p$^+$-InP material cladding layer 37 is then grown over the DBR active waveguide layer 10. The formation of the DBR cladding layer 37 also involves using known techniques (for example by e-beam or holographic lithography) to form a DBR grating 39 in the cladding layer, for example by forming a periodically etched layer of a material such as GaInAsP. Alternatively, the grating may be formed in the buffer layer 18 beneath the subsequently deposited DBR active waveguide layer 10.

Because the DBR active waveguide layer is selectively grown in a gap etched between adjacent laser sections 3, the DBR section 4 is butt-coupled with the adjacent laser sections 3. Thus, when the wafer 15 is cleaved these sections will form monolithically integrated optoelectronic devices 1. The active waveguide layers 9, 10 of the laser section 3 and DBR section 4 are automatically self-aligned in the longitudinal direction along the component axis 5, as long as the DBR active waveguide layer 10 is growth to the correct level above the component substrate 12.

After this, the masks defining areas 24 are removed with 10:1 buffered HF acid.

A second patterned mask, shown by parallel dashed lines 26 in FIG. 1, is used to define a ridge or mesa stripe 25. The grown layers outside the ridge stripe 25 are then removed in a wet-etch process, which cuts down into the buffer layer 18 to form the mesa. It would, however, be possible to use a reactive ion dry etching process. Current confinement regions may then be formed from material deposited outside the paired dashed lines 26.

In FIGS. 2 and 3, the mesa stripe 25 extends perpendicular to the plane of the drawing, and rises above the level of the surrounding etched buffer layer 18. The mesa stripe 25 has left and right opposite side walls 31, 32 that together with the buffer layers 18 and the cladding layers 22, 37 form current conduction regions 46 and 47 for an applied laser current 156 ($I_L$), and optionally also an applied DBR 157 ($I_D$).

As can be seen from the cross-section of FIG. 4, the two active waveguide layers 9, 10 are longitudinally aligned at the butt-coupled junctions 7 between the laser section 3 and DBR section 4. This together with the mesa structure 25 has the effect of guiding an optical mode 50 along the active waveguide layers 9 and 10 within the stripe 25.

The laser current 156 is applied to pump and drive the laser to generate the optical mode 50. The optional DBR current 157 may be varied in order to vary the effective refractive index of the DBR active waveguide layer, and hence tune the wavelength of the optical mode 50. The invention is, however, equally applicable to non-tunable DBR structures and DFB structures.

The width of the mesa stripe 25 varies depending on the particular device, but for opto-electronic devices such as laser diodes, the mesa stripe 25 is usually between 1 μm and 3 μm wide. The mesa strip 25 rises 1 μm to 3 μm above the surrounding buffer layer 18.

A current confinement or blocking structure 30 is then grown on the etched device up to approximately the level of the patterned stripe mask 26. The structure 30 includes a number of layers adjacent the buffer layer 18 including a first p-doped InP layer 17 having a dopant concentration about $1 \times 10^{18}$ cc$^{-1}$ and above this, an n-doped InP layer 28, having a dopant concentration of at least about $1 \times 10^{18}$ cc$^{-1}$. The n-doped InP layer 28 preferably has a substantially constant dopant concentration at least as high as the highest dopant concentration in the p-type layer 17. Finally, a second p-doped InP layer 29 having a dopant concentration about $1 \times 10^{18}$ cc$^{-1}$ is deposited on the n-doped InP layer 28.

The thicknesses of the n-doped layer 28 is about 0.5 μm and the thickness of the first p-doped layer 17 is about 0.4 μm. These InP layers 17, 28 form a p-n junction that in use is reverse biased and hence insulating when the conduction region 46, 47 is forward biased.

The first p-doped layer 17 should be between about one-tenth and one-half the thickness of the n-doped layer 28, that is between about 50 nm and about 250 nm thick.

After deposition of the semiconductor layers 17, 28, 29 used to form the current blocking structure 30, the oxide layer mask 26 is removed with 10:1 buffered HF from the mesa stripe 25 to expose again the cladding layers 22, 37.

An upper cladding layer 60 formed from highly doped p$^+$-InP is then grown above the cladding layers 22, 37 of the mesa stripe 25 and the second p-doped InP layer 29 of the current blocking structure 30, up to a thickness of about 2 μm to 3 μm. The final semiconductor layer is a 100 nm to 200 nm thick ternary cap layer 61 is deposited on the upper cladding layer 60. The cap layer 61 is formed from p$^{++}$-GaInAs, very highly doped to greater than $10^{19}$ cc$^{-1}$, in order to provide a good low resistance ohmic contact for electrical connection to the two current conduction regions 46, 47 of the mesa stripe 25. As an alternative to a ternary cap layer, it is possible to use a quaternary InGaAsP cap layer, or both InGaAsP and InGaAs layers.

Optionally, an isolation etch through the ternary cap layer may be performed in order to help electrically isolate the two sections from each other and to help prevent cross-talk between the sections of the device. In this isolation etch, the InGaAs cap layer 61 is then etched in photolithographically defined areas down to the second p-doped InP layer 29.

Standard metal layers for two electrical contacts 66, 67 to the two portions 3, 4 of each of the optoelectronic devices 1 are then vacuum deposited on the cap layer 61 using well known techniques, followed by metal wet etch in photo-lithographically defined areas. The remaining metal forms two contact pads 66, 67 with good ohmic contact through the cap layer 61.

The resulting wafer 15 is then thinned to a thickness of about 70 μm to 100 μm in a standard way, in order to assist with cleaving. Standard metal layers 70 are then deposited by sputtering on the rear surface of the wafer 15, so enabling electrical contact to be made to the n-side of the devices 1.

As shown in FIG. 6, the wafer 15 is then inscribed and cleaved along cleave lines 80 in the middle of each laser section 3 to form laser sections 3' for each device 1 and cleave lines 81 in the middle of each DBR section 4 to form DBR sections 4' for each device 1. With reference now also to FIG. 5, the resulting bars each have a first end facet 55 and a second end facet 56 which define ends of a laser cavity. The first end facet 55 is on the exposed end of the DBR section 4' and the second end facet 56 is on the end of the laser section 3'. The end facets 55, 56 are then polished and coated with dielectric multilayer coatings to form an anti-reflection coating 57 on the first facet and a high reflection coating 58 on the second facet 56.

After the coated facets 55, 57; 56, 58 have been formed the bars are inscribed and cleaved along longitudinal cleave lines 82 into individual devices 1. The final individual cleaved device 1 is about 300 μm long (i.e. in the direction of the mesa 25) and about 200 μm wide.

Although not shown, after testing the device 1 may be packaged in an industry standard package, with a single mode optical fibre coupled with a spherical lens to an output facet of the laser diode, and with gold bond wires thermal compression bonded onto the metalised contacts 66, 67. Once so packaged, the device may be used to generate optical radiation 90.

Figure 7:
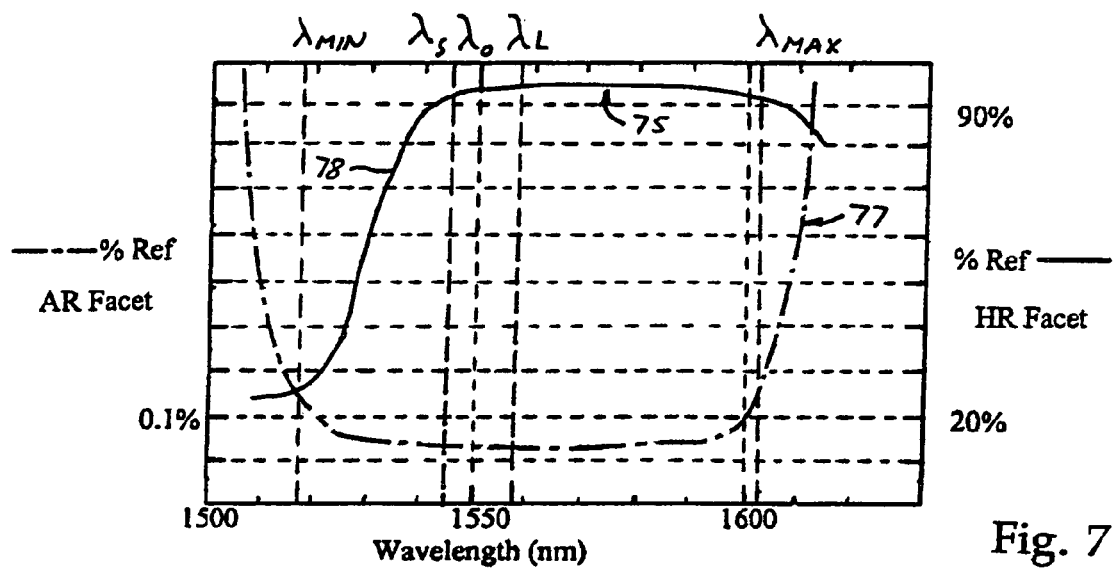
FIG. 7 is a plot of the internal reflectivity of the anti-reflection (AR) facet and the high reflection (HR) facet.
Figure 8:
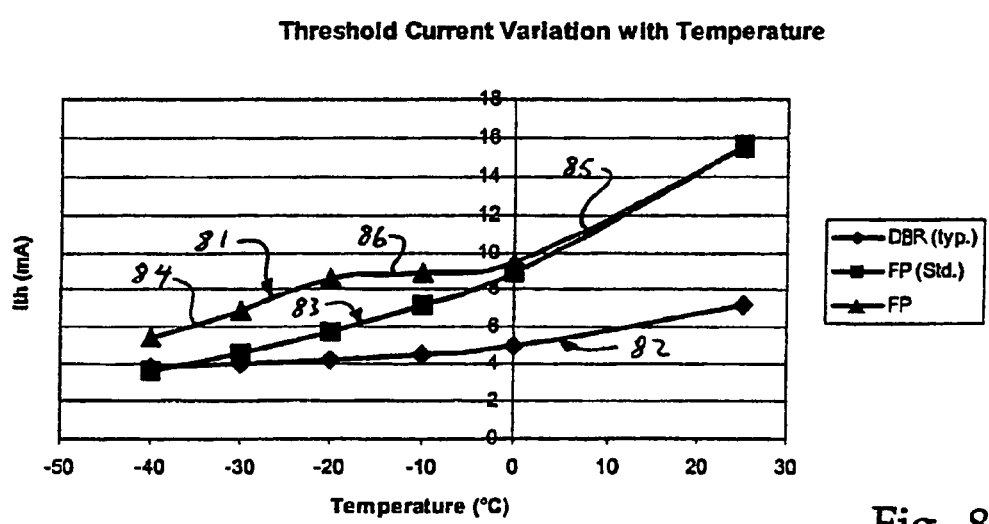
FIG. 8 shows plots of laser section threshold currents for Fabry-Perot and grating modes in the device of FIG. 1, and for comparison also the threshold current for Fabry-Perot modes in a comparable device not employing the invention.

FIGS. 7 and 8 show the reflection characteristics of the coated facets 55, 57; 56, 58. The first coated facet 55, 57 is an anti-reflection (AR) facet that is a low reflectivity band-pass filter extending between a minimum wavelength of about 1518 nm ($\lambda_{MIN}$) and a maximum wavelength of about 1602 nm ($\lambda_{MAX}$). Over this wavelength range the wavelength is as low as about 0.06%, rising in a U-shaped profile to about 0.12% at the minimum and maximum wavelength limits of $\lambda_{MIN}$ and $\lambda_{MAX}$.

As shown in FIG. 7, the AR facet 55, 57 has a U-shaped reflectivity profile 77 against wavelength with a relatively low reflectivity band extending between $\lambda_{MIN}$ and $\lambda_{MAX}$. in contrast, the HR facet 56, 58 has a step-shaped reflectivity profile 75 against wavelength with a step change 78 in reflectivity between a relatively low value, here about 25%, and a relatively higher value, here about 90% to 95%. The reflectivity profiles 75, 77 of FIGS. 7 overlap such that the step change 78 in the HR facet reflectivity occurs in a shorter wavelength half of the low reflectivity bandpass of the AR facet 55, 57.

The device 1 is designed to have a rated temperature range of between −40° C. and 85° C. The nominal operating temperature is 25° C., at which the device is designed to have both Fabry-Perot (FP) modes and grating modes at 1550 nm ($\lambda_0$). The gain of the lasing medium 9 is also at a peak around this nominal wavelength of 1550 nm.

The FP modes shift with temperatures changes either side of the nominal temperature of 25° C. by amount $\Delta\lambda^{FP}$=0.5 nm/° C. The grating modes are less sensitive to temperature changes, and only move by an amount $\Delta\lambda^{G}$=0.08 nm/° C.

Therefore, in the case where the operating temperature is reduced to −40° C., the FP modes will have shifted to about $\lambda_{MIN}$=1518° C. As can be seen from FIG. 7, the HR facet appears at this wavelength to such modes as a medium to low reflectivity facet with a reflectivity of about 25%. The HR facet therefore reduces the gain of the laser cavity in the region of this minimum wavelength $\lambda_{MIN}$.

In contrast, the grating modes will only shift to about $\lambda_S$=1545 nm, at which wavelength the HR facet 56, 58 still has a high reflectivity of about 92%. The FP modes are therefore relatively suppressed by the step change 78 in the HR facet reflectivity relative to the grating modes.

As shown in FIG. 8, this has the effect of raising the threshold current 81 for the FP modes relative to the threshold current 82 of the grating modes and extending the low temperature operation of the device 1 without the need to rely on electrical tuning of the DBR section 4'. However, the invention still provides benefits when electrical tuning of the DBR section 4' is used, as FP modes will still be suppressed at low temperature operation.

FIG. 8 shows that the grating mode has a threshold current vs temperature curve 82 which is below a threshold current vs temperature curve 81 for the suppressed FP modes at any given temperature between the upper temperature limit of about 85° C. and the lower temperature limit of about −40° C. In this example, the threshold current vs temperature curve 81 for the suppressed FP modes has three regions between the upper temperature limit and the lower temperature limit, namely a lower temperature region 84 and a higher temperature region 85 in which the threshold current vs temperature curve has a positive slope, and a middle temperature region 86 in which the threshold current vs temperature curve 81 has a slope which is flatter than in the adjacent lower and higher temperature regions 84, 85.

Also shown for comparison in FIG. 8 is the threshold current 83 for FP modes in device similar to that of the present invention, but having a reflectivity profile for the HR facet that is essentially flat and highly reflecting across the full extent of the wavelength range between $\lambda_{MIN}$ and $\lambda_{MAX}$. From this, it can be seen that the invention provides an approximately 20° C. improvement in the lower temperature operating limit for the device 1.

Although the present invention has been described specifically for the example of a laser diode coupled with a DBR device, the invention is equally applicable to a laser diode having a distributed feedback (DFB) grating as part of the active layer structure of the laser. Such DFB devices are particularly useful in low cost applications, where the optical radiation does not need to be tunable, or controlled to a high degree of precision, for example to within 0.2 nm over the full operating temperature specification.

It should also be noted that the invention is not limited to the use of a mesa current blocking structures of the type described above, and may employ other current confinement techniques and structures.

The invention described above has been described in detail for a device based on an n-InP substrate. However, it is to be appreciated that the invention can also be applied to devices based on a p-InP substrate.

The invention therefore provides a convenient and economical optoelectronic device with improved wavelength stability across a range of operating temperatures.

The invention claimed is:

1. An optoelectronic device, comprising a semiconductor laser for generating optical radiation, and a grating structure for stabilizing the optical wavelength of said optical radiation against temperature induced changes, wherein:

the laser includes a laser cavity defined by a first end facet and a second end facet, the first end facet having a low reflectivity for substantially transmitting said generated optical radiation from said cavity and for suppressing Fabry-Perot modes of the laser cavity relative to at least one grating mode, and the second end facet being a high reflectivity facet for substantially reflecting said generated optical radiation within said cavity;

the laser and grating structure are arranged so that the grating structure stabilizes the optical wavelength of said generated optical radiation between a longer wavelength operating limit $\lambda_L$ and a shorter wavelength operating limit $\lambda_S$ when the temperature of the laser varies between, respectively, an upper temperature limit and a lower temperature limit;

the low reflectivity of the first end facet extends beyond both $\lambda_L$ and $\lambda_S$ to, respectively, a maximum wavelength $\lambda_{MAX}$ and a minimum wavelength $\lambda_{MIN}$ beyond which the reflectivity of the first end facet rises and no longer suppresses Fabry-Perot modes of the laser cavity, wherein the high reflectivity of the second end facet does not extend fully between $\lambda_S$ and $\lambda_{MIN}$ so that Fabry-Perot modes having a wavelength between $\lambda_S$ and $\lambda_{MIN}$ are additionally suppressed relative said at least one grating mode, and wherein said at least one grating mode has a threshold current vs temperature curve which is below a threshold current vs temperature curve for said suppressed Fabry-Perot modes at any given temperature between said upper temperature limit and said lower temperature limit.

2. An optoelectronic device as claimed in claim 1, in which the laser has a lasing medium with a laser gain profile having a peak at a wavelength which lies between $\lambda_L$ and $\lambda_S$.

3. An optoelectronic device as claimed in claim 1, in which the first end facet has a reflectivity of no more than 0.5% to optical radiation within the laser cavity over substantially most of the wavelength range between $\lambda_L$ and $\lambda_S$.

4. An optoelectronic device as claimed in claim 1, in which the second end facet has a reflectivity of at least 80% over substantially most of the wavelength range between $\lambda_S$ and $\lambda_{MAX}$.

5. An optoelectronic device as claimed in claim 1, in which the second end facet has a reflectivity that drops towards shorter wavelengths over substantially most of the wavelength range between $\lambda_S$ and $\lambda_{MIN}$.

6. An optoelectronic device as claimed in claim 5, in which the reflectivity of the second end facet drops to or below 25% between $\lambda_S$ and $\lambda_{MIN}$.

7. An optoelectronic device as claimed in claim 1, in which said threshold current vs temperature curve for said suppressed Fabry-Perot modes has three regions between said upper temperature limit and said lower temperature limit, namely a lower temperature region and a higher temperature region in which the threshold current vs temperature curve has a positive slope, and a middle temperature region in which the threshold current vs temperature curve has a slope which is flatter than in the adjacent lower and higher temperature regions.

8. An optoelectronic device, comprising a semiconductor laser for generating optical radiation, and a grating structure for stabilizing the optical wavelength of said optical radiation against temperature induced changes, wherein:

the laser includes a laser cavity defined by a first end facet and a second end facet, the first end facet having a low reflectivity for substantially transmitting said generated optical radiation from said cavity and for suppressing Fabry-Perot modes of the laser cavity relative to at least one grating mode, and the second end facet being a high reflectivity facet for substantially reflecting said generated optical radiation within said cavity:

the laser and grating structure are arranged so that the grating structure stabilizes the optical wavelength of said generated optical radiation between a longer wavelength operating limit $\lambda_L$ and a shorter wavelength operating limit $\lambda_S$ when the temperature of the laser varies between, respectively, an upper temperature limit and a lower temperature limit:

the low reflectivity of the first end facet extends beyond both $\lambda_L$ and $\lambda_S$ to, respectively, a maximum wavelength $\lambda_{MAX}$ and a minimum wavelength $\lambda_{MIN}$ beyond which the reflectivity of the first end facet rises and no longer suppresses Fabry-Perot modes of the laser cavity, wherein the high reflectivity of the second end facet does not extend fully between $\lambda_S$ and $\lambda$MIN so that Fabry-Perot modes having a wavelength between $\lambda_S$ and $\lambda_{MIN}$ are additionally suppressed relative said at least one grating mode, and wherein the first end facet has a U-shaped reflectivity profile against wavelength with a relatively low reflectivity band extending between $\lambda_{MIN}$ and $\lambda_{MAX}$, the second end facet has a step-shaped reflectivity profile against wavelength with a step change in reflectivity between a relatively low value and a relatively higher value, wherein said reflectivity profiles overlap such that said step change occurs in a shorter wavelength half of said low reflectivity band.

9. A method of fabricating an optoelectronic device, comprising:

forming a semiconductor laser for generating optical radiation;

forming a grating structure for stabilizing the optical wavelength of said optical radiation against temperature induced changes;

providing the laser with a laser cavity defined by a first end facet and a second end facet, the first end facet having a low reflectivity for substantially transmitting said generated optical radiation from said cavity and for suppressing Fabry-Perot modes of the laser cavity relative to at least one grating mode, and the second end facet being a high reflectivity facet for substantially reflecting said generated optical radiation within said cavity;

arranging the laser and grating structure so that the grating structure stabilizes the optical wavelength of said generated optical radiation between a longer wavelength operating limit $\lambda_L$ and a shorter wavelength operating limit $\lambda_S$ when the temperature of the laser varies between, respectively, an upper temperature limit and a lower temperature limit;

selecting the low reflectivity of the first end facet so that this extends beyond both $\lambda_L$ and $\lambda_S$ to, respectively, a maximum wavelength $\lambda$MAX and a minimum wavelength $\lambda_{MIN}$ beyond which the reflectivity of the first end facet rises and no longer suppresses Fabry-Perot modes of the laser cavity; and selecting the high reflectivity of the second end facet so that this does not extend fully between $\lambda_S$ and $\lambda_{MIN}$ so that Fabry-Perot modes having a wavelength between $\lambda_s$ and $\lambda_{MIN}$ are additionally suppressed relative said at least one grating mode, wherein said at least one grating mode has a threshold current vs temperature curve which is below a threshold current vs temperature curve for said suppressed Fabry-Perot modes at any given temperature between said upper temperature limit and said lower temperature limit.

* * * * *